(12) United States Patent
Minamoto (10) Patent No.: US 7,217,975 B2
(45) Date of Patent: May 15, 2007

(54) LATERAL TYPE SEMICONDUCTOR DEVICE

(75) Inventor: Toshiharu Minamoto, Ishikawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 62 days.

(21) Appl. No.: 10/937,777

(22) Filed: Sep. 10, 2004

(65) Prior Publication Data

US 2005/0098853 A1   May 12, 2005

(30) Foreign Application Priority Data

Sep. 12, 2003   (JP)   ............... 2003-320791

(51) Int. Cl.
*H01L 29/76* (2006.01)
(52) U.S. Cl. .............. 257/341; 257/556; 257/565; 257/423; 257/557; 257/611; 257/575; 257/566
(58) Field of Classification Search ........ 257/206, 257/556, 565, 423, 557, 611, 575, 566; 438/271
See application file for complete search history.

(56) References Cited

U.S. PATENT DOCUMENTS

| | | | | |
|---|---|---|---|---|
| 3,878,550 A | * | 4/1975 | Benjamin | 257/579 |
| 5,460,985 A | * | 10/1995 | Tokura et al. | 438/271 |
| 5,789,770 A | * | 8/1998 | Rostoker et al. | 257/206 |
| 6,107,661 A | * | 8/2000 | Okabe et al. | 257/330 |
| 6,541,827 B1 | * | 4/2003 | Takaishi | 257/390 |

FOREIGN PATENT DOCUMENTS

| | | |
|---|---|---|
| JP | 57-100762 | 6/1982 |
| JP | 63-12859 | 1/1988 |
| JP | 63-147842 | 9/1988 |
| JP | 1-95766 | 6/1989 |
| JP | 1-214165 | 8/1989 |
| JP | 2001-44214 | 2/2001 |
| JP | 2001-267327 | 9/2001 |
| JP | 2002-299466 | 10/2002 |

* cited by examiner

*Primary Examiner*—Zandra V. Smith
*Assistant Examiner*—Tsz Chiu
(74) *Attorney, Agent, or Firm*—Oblon, Spivak, McClelland, Maier & Neustadt, P.C.

(57) ABSTRACT

A lateral semiconductor device includes: a semiconductor substrate formed on a base region therein; a plurality of emitter regions with a triangle arrangement in an upper part of the base layer and collector regions surrounding the emitter regions, respectively, apart from the emitter regions with a predetermined space through the base layer; the base layer formed in a concentric circular pattern on the upper part; the emitter regions and collector regions provided with contacts respectively; and emitter and collector wiring layers connected to the contacts.

12 Claims, 5 Drawing Sheets

LATERAL TYPE SEMICONDUCTOR DEVICE

FIELD OF THE INVENTION

The present invention relates to a semiconductor device such as a lateral transistor constituted of a plurality of emitter contacts and a plurality of collector contacts arranged and connected together in parallel respectively on the same semiconductor substrate.

CROSS-REFERENCE TO RELATED APPLICATION

This invention is based upon and claims the benefits of priority from the prior Japanese Patent Applications No. 2003-320791 on Sep. 12, 2003; the entire contents of which are incorporated herein by reference.

BACKGROUND OF THE INVENTION

Figure 9:
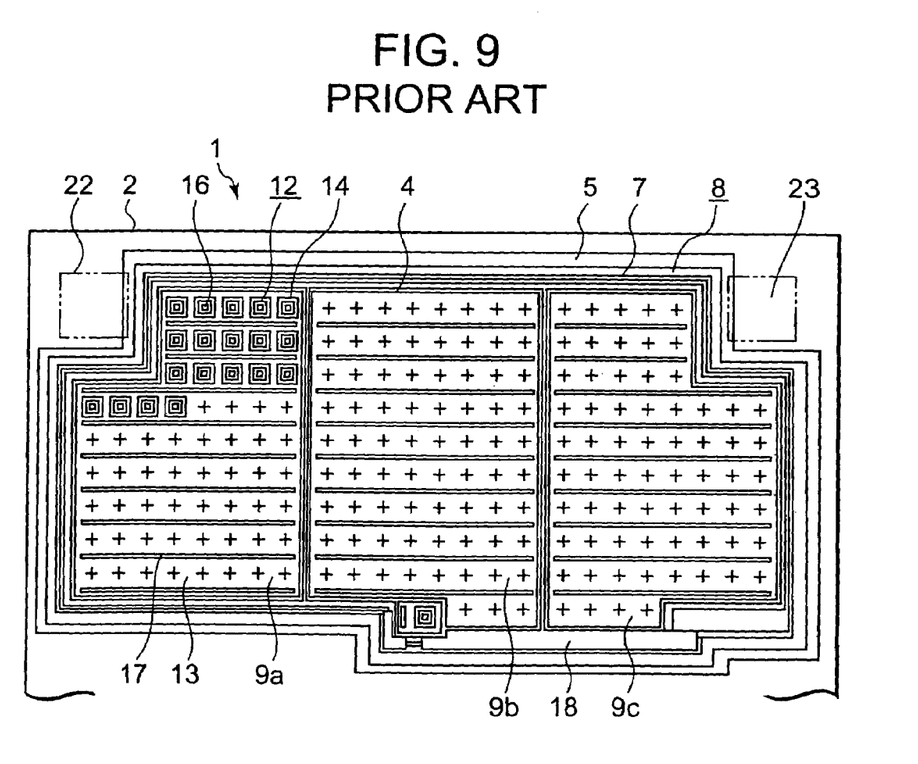
FIG. 9 is a pattern diagram showing the entire structure of the conventional technology.

Referring to FIG. 9, the background technology will be explained.

One of lateral type power transistors used for power sources such as a low drop-out power source is a power transistor having a base layer on an upper part of a semiconductor substrate, a plurality of emitter regions provided separately from each other on an upper part in the base layer, and a collector region provided apart from the emitter region by a predetermined distance so as to surround them, the plurality of emitter regions being connected together in parallel to be used. The power transistor mentioned above is configured as follows.

In FIG. 9, the power transistor 1 has an N+ buried layer formed on a predetermined portion of an upper part of a substantially rectangular P− type semiconductor substrate 2, an N− type base layer 4 formed by vapor phase epitaxy so as to cover the buried layer 3, and a P− isolation region 5 formed on the peripheral part of the base layer 4 by thermal diffusion. The part within the P− isolation region of the base layer 4 is partitioned in three compartments 9a, 9b, and 9c by dividing the inside part in three by means of a guard ring 8 comprised of an N++ region 6 and an N+ region provided on the upper part of the base layer 4, along approximately the periphery of the substrate in parallel with the side of the rectangular outline of the semiconductor substrate 2.

A plurality of emitter regions 12 having a square pattern of a P++ region 10 and a P+ region 11 with a predetermined depth respectively are arranged one by one at a predetermined first pitch in the horizontal direction of the substrate surface and at a predetermined second pitch in the perpendicular direction thereof, on the upper part inside the base layer 4 in each compartment 9a, 9b, or 9c. Furthermore, the upper part of the base region 4 is provided with a P+ collector region 13 in such a manner as to surround each emitter region 12 spaced by a predetermined space, so that a PNP transistor 14 is formed locally with being centered at each emitter region 12.

An insulating layer of such as $SiO_2$ is formed on the base layer 4, the emitter region 12, the collector region 13, etc. A square emitter contact 16 smaller than the emitter region 12 is formed on a part of the insulating layer over the emitter region 12 so as to conduct the emitter region 12. On the other hand, a rectangular collector contact 17 is formed on a part of the insulating layer over the collector region 13 between the emitter regions 12 adjacent to each other in the longitudinal direction along the arranged direction of the emitter regions 12, so as to conduct the collector region 13. Moreover, a base contact 18 is formed on a predetermined part of the periphery of the semiconductor substrate 2.

An emitter wiring patterned to connect in parallel each emitter region 12 through each emitter contact 16 and a collector wiring 20 patterned to connect in parallel each collector region 13 through each collector contact 17 is formed on the insulating layer. Reference numbers 22 and 23 designate a collector pad and an emitter pad respectively provided on the insulating layer 15.

However, because the rectangular collector contact 17 in the conventional technology is provided in the direction of the arrangement of the emitter regions 12 between two emitter regions 12 adjacent to each other in the longitudinal direction, the distance between the PNP transistor units 14 centered at each emitter unit 12 cannot be decreased. That is, the above fact causes difficult situation to make the power transistor 1 be more miniaturized.

In addition, the collector contact 17 is formed adjacent to each emitter contact 16 in the longitudinal direction, so that the electric current when the transistor is operated concentrates on a part where the collector contact 17 is nearest to each emitter contact 16. Therefore, the electric current does not flow effectively to the collector region 13, and this leads to a low electric current efficiency.

Additionally, because the base contact 18 is located on a predetermined part of the periphery of the semiconductor substrate 2 and the guard ring 8 is provided so as to divide the inside of the semiconductor substrate 2 in parallel with the side of the rectangular outline into three compartments, the base resistance component of the PNP transistor unit 14 becomes large as the transistor unit gets close to the central part inside the divided three compartments 9a, 9b, and 9c. In consequence, the PNP transistor 14 becomes difficult to be operated and especially the current gain at the large current region becomes deteriorated. Though it is therefore necessary that number of the PNP transistor units should be increased to improve the characteristics, this matter is contrary to miniaturizing the power transistor 1.

SUMMARY OF THE INVENTION

According to one embodiment of the present invention, a semiconductor device comprises:

a semiconductor substrate;

a base layer formed on an upper part of the semiconductor substrate;

a plurality of emitter regions, each row thereof being provided on an upper part in the base layer at an equal interval in a first direction of a surface of the substrate, being arranged with a predetermined pitch for odd number rows in a second direction substantially perpendicular to the first direction, and being arranged with the predetermined pitch for even number rows in the second direction at a position shifted by ½ of the predetermined pitch to the arrangement of the odd number rows;

a collector region provided on the upper part of the base layer to surround each of the emitter regions with a predetermined space;

an insulating layer provided on the base layer, the emitter layer, and the collector layer;

an emitter contact formed on the emitter region by opening an upper part of the insulating layer in a predetermined shape;

a collector contact formed on the collector region by opening an upper part of the insulating layer in a predetermined shape; and a wiring layer comprising an emitter wiring and a collector wiring on the insulating layer, both the wirings having predetermined pattern and connecting the emitter contact and the collector contact respectively.

In accordance with another embodiment of the present invention, a semiconductor device comprises:

a semiconductor substrate;

a base layer formed on an upper part of the semiconductor substrate;

a plurality of emitter regions, each row thereof being provided on an upper part in the base layer at an equal interval in a first direction of a surface of the substrate, being arranged with a predetermined pitch for odd number rows in a second direction substantially perpendicular to the first direction, and being arranged with the predetermined pitch for even number rows in the second direction at a position shifted by a predetermined pitch to the arrangement of the odd number rows;

a collector region provided on the upper part of the base layer to surround each of the emitter regions with a predetermined space;

an insulating layer provided on the base layer, the emitter layer, and the collector layer;

an emitter contact formed on the emitter region by opening an upper part of the insulating layer in a predetermined shape;

at least three collector contacts formed on the collector region by opening an upper part of the insulating layer in a predetermined shape, positioned adjacent to each of the emitter contacts and located to have an equal space to one emitter contact; and a wiring layer comprising an emitter wiring and a collector wiring on the insulating layer, both the wirings having predetermined pattern and connecting the emitter contact and the collector contact in parallel respectively.

According to further embodiment of the present invention, a semiconductor device comprises:

a semiconductor substrate;

a base layer formed on an upper part of the semiconductor substrate;

a plurality of emitter regions, each row thereof being provided on an upper part in the base layer at an equal interval in a first direction of a surface of the substrate, being arranged with a predetermined pitch for odd number rows in a second direction substantially perpendicular to the first direction, being arranged with the predetermined pitch for even number rows in the second direction at a position shifted by ½ of the predetermined pitch to the arrangement of the odd number rows, and adjacent ones thereof being positioned at vertexes of an equilateral triangle respectively;

a collector region provided on the upper part of the base layer to surround each of the emitter regions with a predetermined space;

a guard ring provided on the upper part of the base layer to divide the collector regions and the emitter regions by being provided to be inclined at 60 degrees to the arranged direction of the emitter region;

an insulating layer provided on the base layer, the emitter layer, and the collector layer;

an emitter contact formed on the emitter region by opening an upper part of the insulating layer in a predetermined shape;

a collector contact formed over the collector region by opening an upper part of the insulating layer in a predetermined shape, and positioned for each of the emitter contact at each vertex of an equilateral triangle, the center of gravity thereof being on the emitter contact, to share at least one of the adjacent emitter contacts;

a base contact formed on the base region of the periphery of the semiconductor substrate surrounding the collector region by opening an upper part of the insulating layer; and a wiring layer comprising an emitter wiring and a collector wiring on the insulating layer, both wirings having predetermined pattern and connecting the emitter contact and the collector contact in parallel respectively.

In accordance with another embodiment of the present invention, a semiconductor device comprises:

a semiconductor substrate;

a base layer formed on an upper part of the semiconductor substrate;

a plurality of emitter regions, each row thereof being provided on an upper part in the base layer at an equal interval in a first direction of a surface of the substrate, being arranged with a predetermined pitch for odd number rows in a second direction substantially perpendicular to the first direction, and being arranged with the predetermined pitch for even number rows in the second direction at a position shifted by ½ of the predetermined pitch to the arrangement of the odd number rows; and the emitter contacts of a plurality of adjoining emitter regions being provided in a pattern where each of the emitter contacts is placed on each vertex of an isosceles triangle one by one.

DETAILED DESCRIPTION OF THE INVENTION

Figure 1:
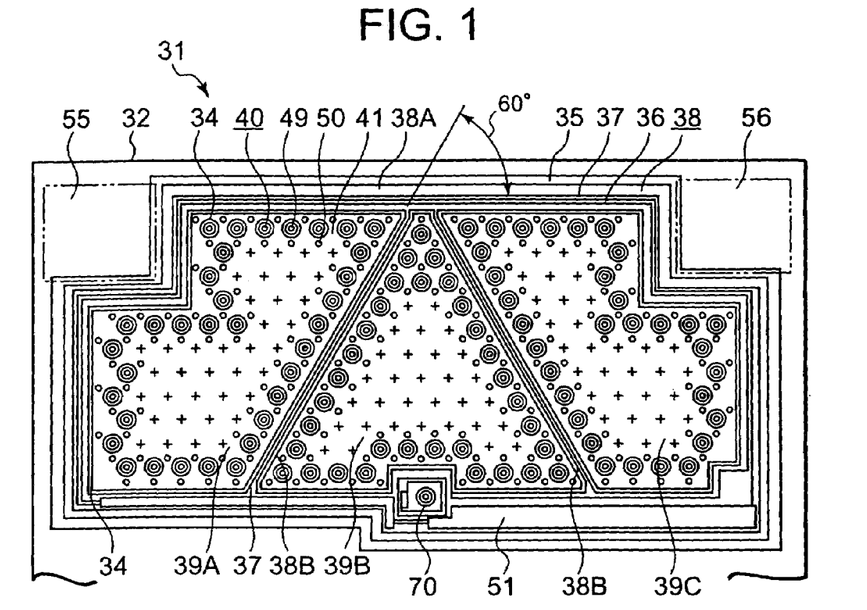
FIG. 1 is a plan view showing the pattern of the entire structure of one embodiment of the present invention.
Figure 2:
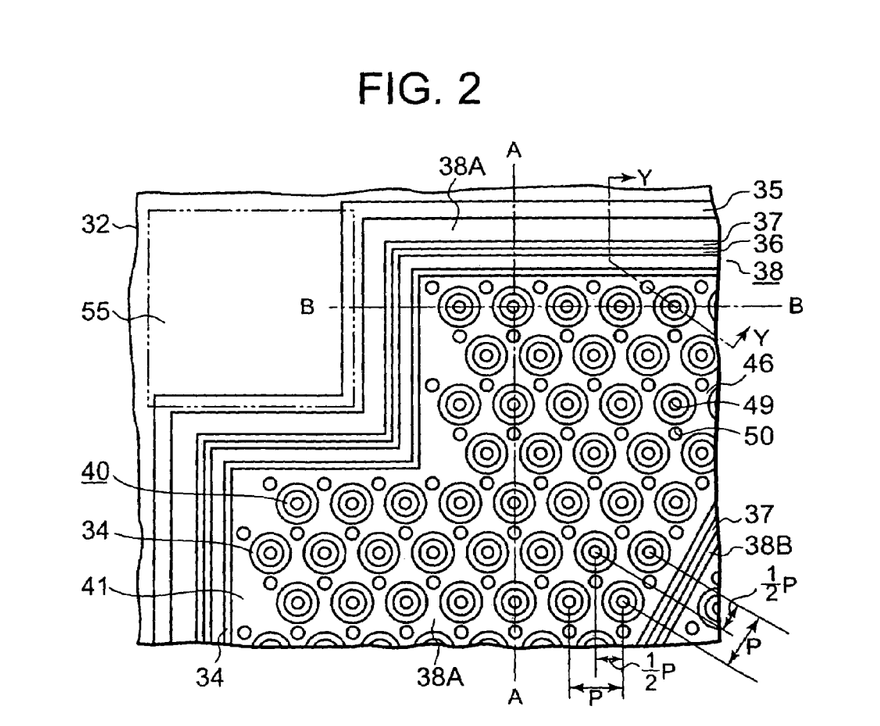
FIG. 2 is a plan view showing a partial pattern in an embodiment of the present invention.
Figure 3:
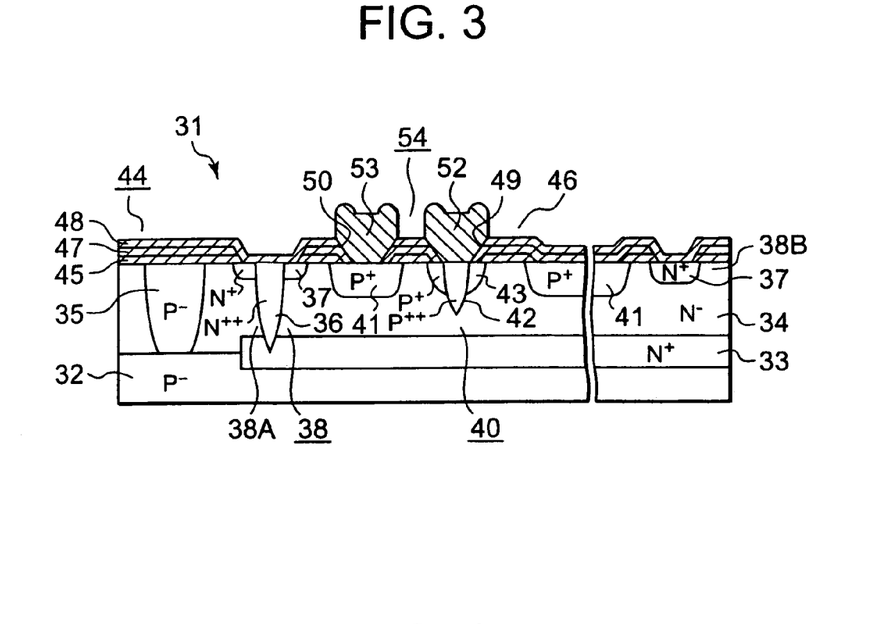
FIG. 3 is a cross section diagram viewed in the direction of Y—Y arrows in FIG. 2.
Figure 4:
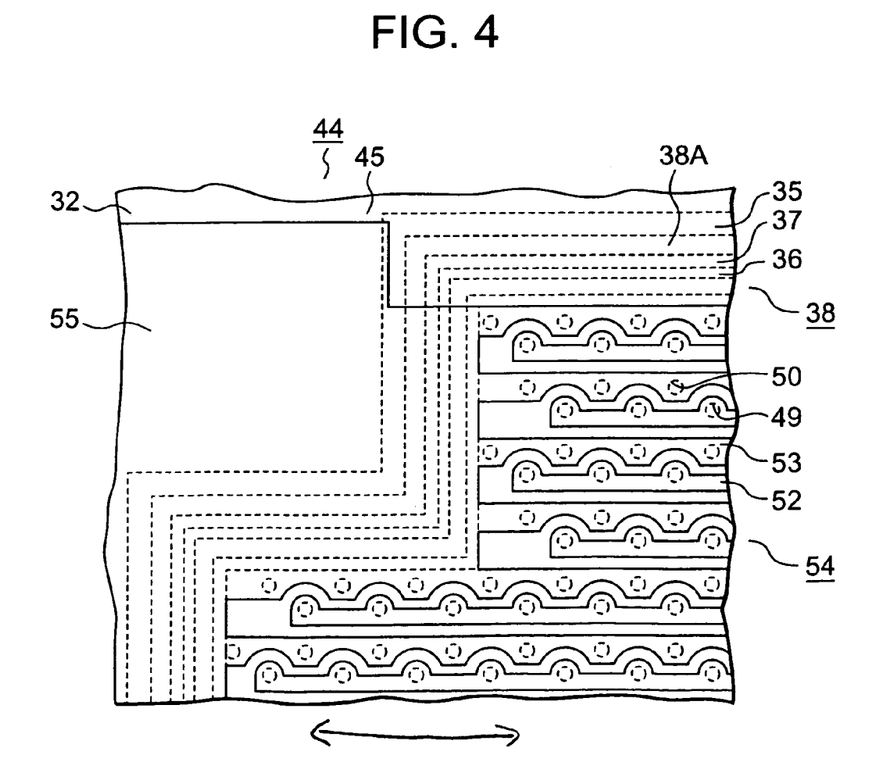
FIG. 4 is a plan view showing the wiring condition in the collector pad side portion of an embodiment of the present invention.
Figure 6:
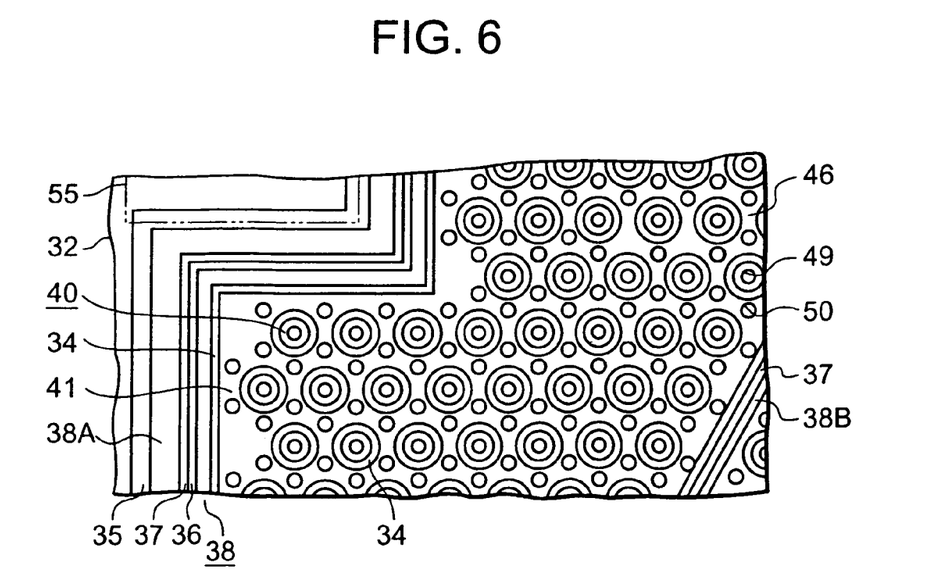
FIG. 6 is a plan view showing a partial pattern of the first variation relating to an embodiment of the present invention.
Figure 7:
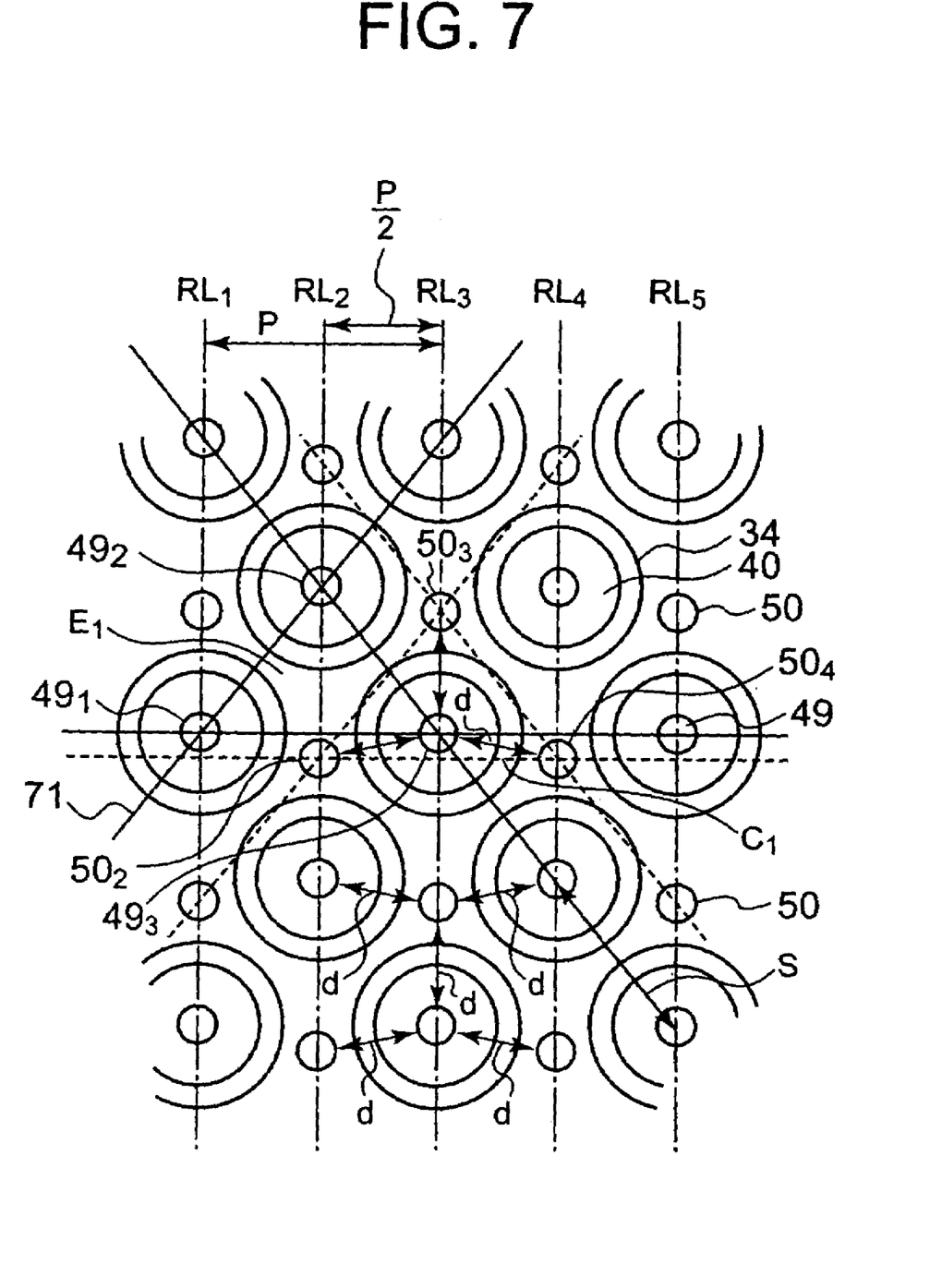
FIG. 7 is an enlarged plan view showing the partial pattern of the other embodiment of the present invention.

Referring to FIG. 1 to FIG. 7, an embodiment of the present invention will be hereinafter explained. FIG. 1 is a pattern diagram showing the entire construction; FIG. 2 is a partial pattern diagram; FIG. 3 is a cross section at Y—Y line viewed in the arrow direction in FIG. 2; FIG. 4 is a plan view showing the wiring state in the emitter pad side part; FIG. 6 is a partial pattern diagram showing the first variation; and FIG. 7 is a cross section of the second variation.

In FIG. 1 to FIG. 7, a power transistor 31 is provided with a substantially rectangular P⁻ type silicon semiconductor substrate 32 whose mirror-polished surface has an oxide film (not shown) formed by thermal oxidation. Then, the formed oxide film is patterned so that an opening can be formed at a predetermined part thereof. Furthermore, an N⁺ buried layer 33 having a predetermined plane shape is formed on a predetermined part of the upper portion of the semiconductor substrate 32 through the opening by patterning by the aid of thermal diffusion of for example arsenic or antimony on the upper portion of the semiconductor substrate 32. On the upper surface of the semiconductor substrate 32, an N⁻ type epitaxial layer to become a base layer 34 having a predetermined thickness is formed by vapor phase epitaxy so as to cover the N⁺ buried layer 33. In addition, a P⁻ isolation region 35 reaching the upper surface of the semiconductor substrate 32 is formed on the peripheral portion of the epitaxial layer by thermal diffusion of e.g. boron, along approximately the outline shape of the N⁺ buried layer 33. Thereby, the base layer 34 is formed on a part within the P⁻ isolation region 35.

In the base layer 34 inside the P⁻ isolation region 35, a guard ring 38 comprised of an N⁺⁺ region 36 and an N⁺ region 37 of the base region is prepared on the upper part of the base layer 34 by means of thermal diffusion of e.g. arsenic or antimony in the upper part of the semiconductor substrate 32. As shown in FIG. 1, the guard ring 38 has a peripheral portion 38A having an N⁺⁺ region 36 and an N⁺ region 37 provided in parallel with the sides of the rectangular outline of the semiconductor substrate 32 along the shape of the P⁻ isolation region 35. Two tilted portions 38B formed by an N⁺ region crossing the peripheral portion 38A between the opposite two sides of the peripheral portion 38A at an angle of 60 degrees and spreading together in two different directions like the Greek letter Λ (lambda) are provided.

The inside area within the peripheral portion 38A of the guard ring 38 is therefore divided into three partitions, i.e. three compartments 39A, 39B, 39C by the two tilted portions 38B. For the guard ring 38, the N⁺⁺ region 36 of the peripheral portion 38A is formed first up to the depth getting to the N⁺ buried layer 33, then an emitter region 40 and a collector region 41 described hereinafter are formed, and thereafter the N⁺ region is formed.

After the N⁺⁺ region 36 of the guard ring 38 has been formed, the emitter region 40 comprised of a P⁺⁺ region 42 and a P⁺ region 43 is formed on a predetermined position of the upper part in the base layer 34 within the P⁻ isolation layer 35 and the N⁺⁺ region 36 of the guard ring 38. With regard to the position on which the emitter region 40 is formed in this case, each row of the emitter region is located at an equal interval together in the longitudinal direction of the substrate surface i.e. the first direction A of the upper part in the base layer 34 parallel to the longitudinal side of the rectangular outline of the semiconductor substrate 32, and each of the emitter regions 40 is arranged with a predetermined pitch p in the lateral direction i.e. the second direction B substantially perpendicular to the first direction for each odd number row, and arranged with the same pitch p at each position shifted from the arrangement of the odd number row by ½ of the predetermined pitch p in the lateral direction for each even number row. That is to say, each of the emitter regions is positioned in a staggered arrangement. In addition, adjoining three emitter regions 40 on neighboring two rows are provided so as to be placed respectively on each vertex of an equilateral triangle. Therefore, the emitter regions 40 form a dense pattern arranged with the same pitch also in the direction parallel to the tilted portion 38B of the guard ring 38 crossing the direction of the row by an angle of 60 degrees. In this case, the first direction A and the second direction B are determined by the arrangement pattern of the emitter region, and the longitudinal side of the rectangular substrate 32 is the criterion in this embodiment.

Regarding to formation of the emitter region (not shown by a figure), P⁺⁺ region 42 is formed first: i.e. an oxide film is formed on the base layer 34; then a mask having a predetermined pattern is formed on the oxide film by means of patterning by photo-etching method using a photoresist; thereafter the oxide film is opened by etching; and then e.g. boron is diffused through the formed opening on a predetermined position of the upper part in the base layer 34. On the other hand, the P⁺ region 43 is formed simultaneously when the P⁺ type collector region 41 is formed.

In other words, the collector region 41 is provided on the upper part in the base layer 34 so as to surround each emitter region 40 with a predetermined space. In this embodiment, because the emitter region 40 has a circular pattern, the concentric circular base layer 34 is interposed between the collector region 41 and the emitter region 40. With regard to formation of the P⁺ region 43 of the emitter region 40 and the P⁺ type collector region 41, a first silicon oxide film (SiO₂) 45 constituting an insulating layer 44 on the entire surface of each layer and each region formed on the semiconductor substrate 32 is formed first, and then an opening is formed at a predetermined position of the first silicon oxide film 45 by means of patterning and etching by photoetching method using photoresist. Subsequently, boron, for example, is diffused into the upper part in the base region 34 through each formed opening up to a predetermined depth, which does not reach the N⁺ buried layer 33. Thereby, a PNP transistor unit 46 is locally formed on a position centered at each emitter region 40.

After the emitter region 40 and the collector region 41 have been formed, a second silicon oxide film 47 constituting the insulating layer 44 is formed again on the entire surface and patterned and etched as well. Then, the peripheral portion 38A and the two tilted portions 38B of the guard ring 38 are formed by diffusing e.g. phosphorus into the upper part in the base layer up to a predetermined depth, which does not reach the N⁺ buried layer 33, through the opening formed on the position where the N⁺ region 37 of the guard ring 38 is formed.

After the N⁺ region of the guard ring 38 has been formed, a third silicon oxide film 48 constituting the insulating layer 44 is formed again on the entire surface. Then, a predetermined position of the insulating layer 44 is opened in the shape of, for example, a circle by means of patterning and then etching by photoetching method using photoresist, whereby an emitter contact 49 and a collector contact 50 are formed, each of the upper surfaces of the P⁺⁺ region 42 of the emitter region 40 and the P⁺ type collector region 41 being exposed to the inner bottom portion of the emitter contact 49 or the collector contact 50. The emitter contact 49 thus formed is provided on the central portion of each emitter region 40, and the collector contact 50 is provided for each of the emitter contacts 49 on each of the vertexes of the equilateral triangle whose center of gravity is on the corresponding emitter contact 49. The space between the periphery of the emitter contact 49 and the periphery of each collector contact 50 at the vertex is equal to each other, and each of the collector contacts is configured to be shared by the adjoining emitter contacts 49. At the same time as the emitter contact 49 and the collector contact 50 being formed, a predetermined position of the insulating layer 44 along the peripheral portion 38A of the guard ring 38 is opened in the shape of approximately a rectangle, and a base contact 51 is formed on the inner bottom portion of the opening to which the corresponding upper surface of the N++ region 36 of the base region is exposed.

Figure 5:
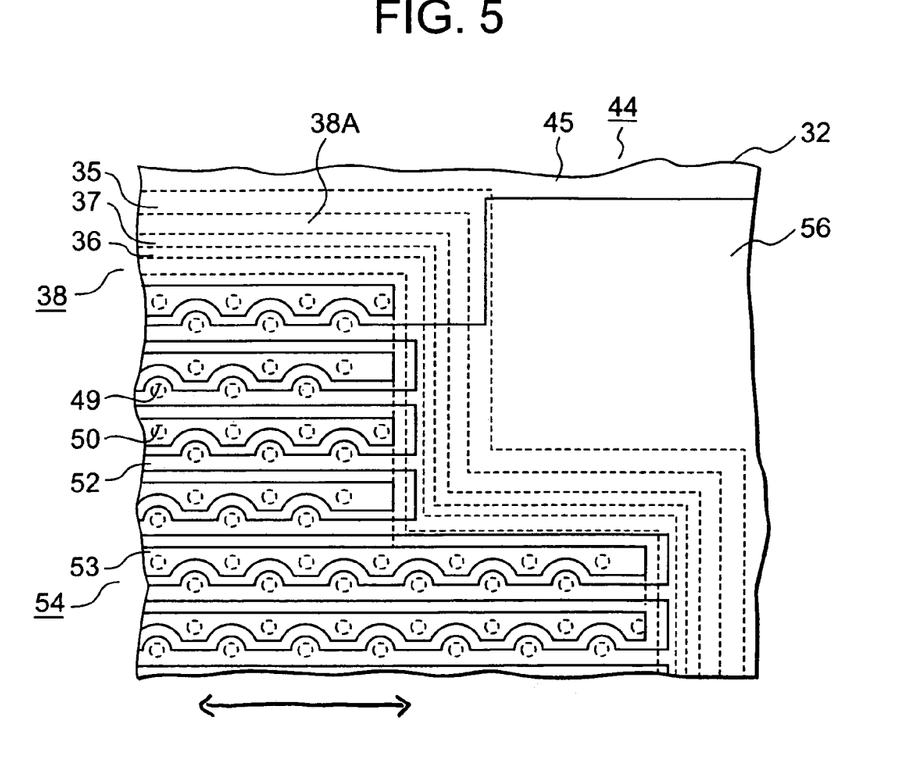
FIG. 5 is a plan view showing the wiring condition in the emitter pad side portion of an embodiment of the present invention.

As shown in FIGS. 3 to 5, on the third silicon oxide film 48 of the insulating layer 44 on which the emitter contact 49, the emitter contact 50, and the base contact 51 are formed, an emitter wiring 52 patterned like teeth of a comb to connect each emitter region 40 together in parallel through each emitter contact 49 is formed. A collector wiring 53 patterned like teeth of a comb to connect each collector region 41 together in parallel through each collector contact 50 is also formed. The emitter wiring 52 and the collector wiring 53 are extended in the second direction (as indicated by the arrow in FIGS. 4 and 5), and formed on the same layer surface as an interdigital pattern in which the two wirings alternate together with a predetermined insulating distance.

Therefore, the power transistor 31 is constituted of a plurality of the PNP transistor units 46 centered at each emitter region 40, which are connected in parallel together to share the same base layer 34. With regard to formation of the wiring layer 54, aluminum is evaporated first on the third silicon oxide film 48 so as to bury the contacts 49 and 50, and an aluminum film to become the wiring layer 54 is deposited. Thereafter, a mask of a predetermined pattern is formed by means of patterning by photoetching method using a photoresist. Then, etching of the aluminum film is carried out using the mask, and the emitter wiring 52, the collector wiring 53 of the predetermined pattern are formed. Reference numbers 55 and 56 are a collector pad and an emitter pad respectively provided on the insulating layer 44 at the both opposite corner portions of the semiconductor substrate 32 at the same time as the wiring layer 54 being formed. The power transistor of this embodiment is designed for the low drop-out power source, so that a transistor 70 is independently formed adjacent to the base contact 51 on the bottom side of the substrate. This transistor is comprised of the power transistor 31 connected commonly with the base and the emitter to constitute for example an overcurrent protection circuit of the power transistor.

Figure 8:
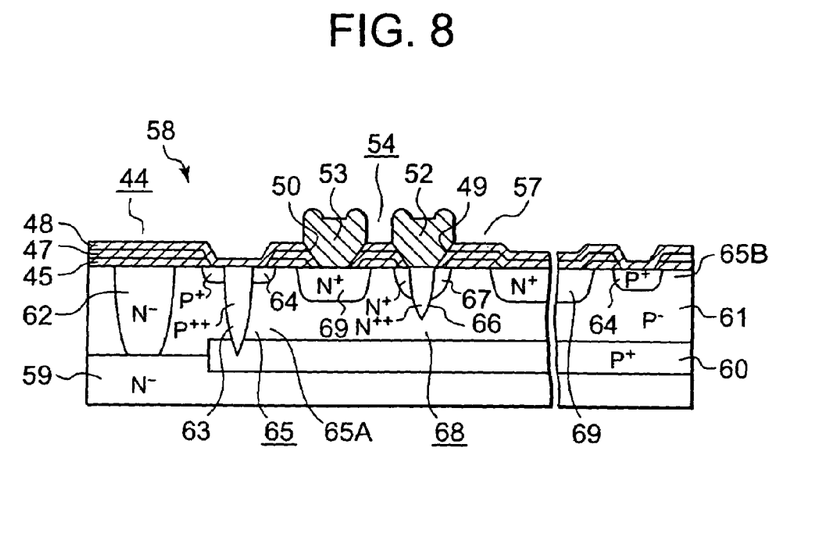
FIG. 8 is a cross section diagram showing the second variation relating to an embodiment of the present invention.

In accordance with the construction described above, the emitter wiring 52 and the collector wiring 53 are formed by the single-layered wiring layer 54, whereas each neighboring emitter region 40 is arranged effectively with the same space. Thus the distance between the PNP transistor units 46 centered at each emitter region 40 can be narrowed, and the power transistor 31 more miniaturized can be constructed. For reference's sake, the conventional power transistor 1 in which 199 pieces of the PNP transistor units 14 are formed in FIG. 8 is compared with the power transistor 31 of this embodiment in which 199 pieces of the PNP transistor 46 are also formed in FIG. 1. The power transistor of this embodiment can be miniaturized up to 72.8% in size of the conventional type one.

Because three collector contacts 50 are provided at positions having an equal distance to each of the emitter contacts 49 and the space among the three collector contacts 50 can be the same, current flows almost equally in each collector contact 50. Therefore, current flows effectively to the collector region 41 so that current efficiency can be improved.

The peripheral portion 38A of the guard ring 38 is provided along the shape of the P⁻ isolation region, and the tilted portion 38B dividing the region inside the peripheral portion 38A where the PNP transistor units 46 are formed into three compartments 39A, 39B, and 39C is provided so as to be parallel to the obliquely arranged direction of the PNP transistor units 46 arranged with a predetermined pitch also in the direction of 60 degrees to the laterally arranged direction. Even the PNP transistor units 46 positioned at the central portion in the three compartments 39A, 39B, and 39C do not have an extremely high base resistance component, so that there is no possibility that they are difficult to be operated and decreasing of the current gain at a large current range can be diminished. Moreover it is not necessary to increase the number of the PNP transistor units for improving the characteristics thereof.

In the aforementioned embodiment, the collector contacts 50 are provided on three positions distant equally from the emitter contact 49 and apart from each other with an equal space. Like a first variation shown by FIG. 6 in which the same part is designated by the same mark, each of six collector contacts 50 are located on each vertex of a regular hexagon whose center of gravity is on the emitter contact 49. The space between the collector contact 50 and the emitter contact 49 and the space between neighboring two collector contacts 50 are arranged to be equal together. The emitter wiring 52 and the collector wiring corresponding thereto are patterned appropriately to provide the single-layered wiring layer 54, to be able to miniaturize.

In the embodiment described above, the PNP transistor units 46 are arranged so that the spaces between any adjacent emitter regions 40 can be equal to each other. In the embodiment shown in FIG. 7, rows (RL1, RL2, RL3, RL4 and so on) of the PNP transistor units 46 arranged in the lateral direction (the second direction) with a predetermined pitch P are arranged also with the predetermined pitch P but shifted by ½ of the predetermined pitch P for the adjacent row, to make the pitch S between the emitter contacts 49 of the neighboring rows in the longitudinal direction (the first direction) differ from the interline pitch P. That is to say, for example, a triangle pattern whose vertexes are on the emitter contacts $49_1$, $49_2$, and $49_3$ on the unit rows RL1, RL2, and RL3 forms an isosceles triangle E1. Like the above, by arranging the emitter contacts in an isosceles triangle pattern, nearly dense arrangement of the emitter regions can be achieved, so that the semiconductor substrate can be miniaturized. The tilted portion 38B of the guard ring 38 shown in FIG. 1 is provided parallel to the oblique arrangement 71 of the PNP transistor units 46 arranged obliquely to the lateral arrangement of the emitter regions 40. The collector contact 50 can be provided so as to assure a predetermined insulating distance between the emitter wiring 52 and the collector wiring 53 (Refer to FIG. 4), and a plurality of the collector contacts 50 for example three or more may be provided at positions having an equal distance from the emitter contact 49. With regard to e.g. the collector contacts $50_2$, $50_3$, and $50_4$ arranged so as to surround the emitter contact $49_3$ of the row RL3 with the same space D in FIG. 7, a triangle surrounded by the dotted lines connecting these collector contacts forms the isosceles triangle C1. The same mark as that of FIG. 1 to FIG. 6 designates the same part. The triangle C1 that is the arrangement pattern of the collector contact is congruent with the triangle E1 that is the arrangement pattern of the emitter contact. The emitter wiring (not shown) extends in the second direction and connects commonly emitter contacts on a line. In the same way, the collector wiring (not shown) extends in the second direction and connects commonly collector contacts on a line adjacent to the emitter contact. Though the emitter wiring and the collector wiring are formed on the same layer surface, further miniaturization can be realized by patterning separately each wiring layer of a two-layered wiring layer having an inter-layer insulating layer intervening between the emitter wiring 52 and the collector wiring 53.

Furthermore, though the power transistor 31 is formed so as to connect the PNP transistor units 46 together in parallel in the aforementioned embodiments and variations, a power transistor 58 can be formed by connecting NPN transistor units 57 together in parallel as the second variation shown in FIG. 7. Reference number 59 is an N⁻ type silicon semiconductor substrate; number 60 is a P⁺ buried layer; number 61 is a P⁻ type base layer; number 62 is an N⁻ isolation region, numbers 63 and 64 are a P⁺⁺ region and a P⁺ region respectively of a guard ring 65 having a peripheral portion 65A and a tilted portion 65B; numbers 66 and 67 are an N⁺⁺ region and an N⁺ region respectively of an emitter region 68; and number 69 is an N⁺ type collector region.

As has been clarified by the explanations mentioned above, the space between emitter regions can be narrowed and thereby the device can be miniaturized in accordance with the present invention. Moreover, the electric current can be effectively flown toward the collector region, so that the current efficiency can be improved thanks to the present invention.

What is claimed is:

1. A lateral semiconductor device comprising:
   a semiconductor substrate;
   a base layer formed on an upper part of the semiconductor substrate;
   a plurality of emitter regions formed in a circular pattern arranged in a plurality of rows, each row thereof being provided on an upper part in the base layer at an equal interval in a first direction of a surface of the substrate, being arranged with a predetermined pitch for odd number rows in a second direction substantially perpendicular to the first direction, and being arranged with the predetermined pitch for even number rows in the second direction at a position shifted by ½ of the predetermined pitch to the arrangement of the odd number rows;
   a collector region provided on the upper part of the base layer to surround each of the emitter regions with a predetermined space and to form a concentric circular base layer interposed between the collector region and the emitter regions;
   an insulating layer provided on the base layer, the emitter regions, and the collector region;
   an emitter contact formed on the emitter regions through an opening of the insulating layer;
   a collector contact formed on the collector region through an opening of the insulating layer; and
   a wiring layer comprising an emitter wiring and a collector wiring on the insulating layer, both the wirings having a predetermined pattern and connecting the emitter contact and the collector contact in parallel respectively.

2. The lateral semiconductor device as stated in claim 1, wherein a space between emitter regions adjacent to each other provided in the odd number row and the even number row adjacent to each other in the first direction is equal to the predetermined pitch.

3. A lateral semiconductor device comprising:
   a semiconductor substrate;
   a base layer formed on an upper part of the semiconductor substrate;
   a plurality of emitter regions formed in a circular pattern arranged in a plurality of rows, each row thereof being provided on an upper part in the base layer at an equal interval in a first direction of a surface of the substrate, being arranged with a predetermined pitch for odd number rows in a second direction substantially perpendicular to the first direction, and being arranged with the predetermined pitch for even number rows in the second direction at a position shifted by a predetermined pitch to the arrangement of the odd number rows;
   a collector region provided on the upper part of the base layer to surround each of the emitter regions with a predetermined space and to form a concentric circular base layer interposed between the collector region and the emitter regions;
   an insulating layer provided on the base layer, the emitter regions, and the collector region;
   an emitter contact formed on the emitter regions through an opening of the insulating layer in a circular shape;
   at least three collector contacts formed on the collector region through an opening of the insulating layer, positioned adjacent to each of the emitter contacts and located to have an equal space to one emitter contact; and
   a wiring layer comprising an emitter wiring and a collector wiring on the insulating layer, both the wirings having a predetermined pattern and connecting the emitter contact and the collector contact in parallel respectively.

4. The lateral semiconductor device as stated in claim 3, wherein a space between emitter regions adjacent to each other provided in the odd number row and the even number row adjacent to each other in the first direction is equal to the predetermined pitch.

5. A lateral semiconductor device comprising:
   a semiconductor substrate;
   a base layer formed on an upper part of the semiconductor substrate and isolated by an isolation region;
   a plurality of emitter regions formed in a circular pattern arranged in a plurality of rows, each row thereof being provided on an upper part in the base layer at an equal interval in a first direction of a surface of the substrate, being arranged with a predetermined pitch for odd number rows in a second direction substantially perpendicular to the first direction, being arranged with the predetermined pitch for even number rows in the second direction at a position shifted by ½ of the predetermined pitch to the arrangement of the odd number rows, and adjacent ones thereof being positioned at vertexes of an equilateral triangle respectively;
   a collector region provided on the upper part of the base layer to surround each of the emitter regions with a predetermined space and to form a concentric circular base layer interposed between the collector region and the emitter regions;
   a guard ring provided on the upper part of the base layer to divide the collector regions and the emitter regions by being provided to be inclined at 60 degrees to the arranged direction of the emitter regions, the guard ring being a region of a higher impurity density and a same conductivity as the base layer;
   an insulating layer provided on the base layer, the emitter regions, and the collector region;
   an emitter contact formed on the emitter region through an opening of the insulating layer in a predetermined shape;
   a collector contact formed on the collector region through an opening of the insulating layer in a predetermined shape, and positioned for each of the emitter contact at each vertex of an equilateral triangle a center of gravity thereof being on the emitter contact, to share at least one of the adjacent emitter contacts;

a base contact formed on the base region of the periphery of the semiconductor substrate surrounding the collector region by opening an upper part of the insulating layer; and a wiring layer comprising an emitter wiring and a collector wiring on the insulating layer, both the wirings having predetermined pattern and connecting the emitter contact and the collector contact in parallel respectively.

6. The lateral semiconductor device as stated in claim 1, wherein three emitter contacts adjacent to each other are provided on each vertex of an isosceles triangle.

7. The lateral semiconductor device as stated in claim 1, wherein a triangle pattern formed by three emitter contacts and a triangle pattern formed by three collector contacts surrounding and being adjacent to one of the three emitter contacts with an equal distance are substantially congruent.

8. The lateral semiconductor device as stated in claim 7, wherein the three collector contacts are provided corresponding to the emitter contact, and the wiring layer of the emitter contact and the wiring layer of the collector contacts are formed on a same layer surface.

9. The lateral semiconductor device as stated in claim 1, wherein the emitter wiring and the collector wiring are positioned alternately and in parallel together.

10. The lateral semiconductor device as stated in claim 9, wherein an extending direction of each of the wirings is the second direction.

11. The lateral semiconductor device as stated in claim 1, wherein the emitter regions are substantially circular.

12. The lateral semiconductor device as stated in claim 1, wherein the collector contact is located on the collector region interposed by three emitter regions.

* * * * *